United States Patent
Grimminger et al.

(10) Patent No.: US 10,408,529 B2
(45) Date of Patent: Sep. 10, 2019

(54) DOMESTIC REFRIGERATION APPLIANCE AND METHOD FOR OPERATING A DOMESTIC REFRIGERATION APPLIANCE

(71) Applicant: BSH HAUSGERAETE GMBH, Munich (DE)

(72) Inventors: Jochen Grimminger, Tapfheim (DE); Andreas Lindel, Heidenheim (DE); Christian Schmid, Aalen (DE); Hans Peter Werner, Giengen (DE); Gerhard Wetzl, Sontheim (DE); Martin Gebler, Pullach (DE)

(73) Assignee: BSH Hausgeraete GmbH, Munich (DE)

( * ) Notice: Subject to any disclaimer, the term of this patent is extended or adjusted under 35 U.S.C. 154(b) by 26 days.

(21) Appl. No.: 15/552,129

(22) PCT Filed: Jan. 27, 2016

(86) PCT No.: PCT/EP2016/051676
§ 371 (c)(1),
(2) Date: Aug. 18, 2017

(87) PCT Pub. No.: WO2016/134912
PCT Pub. Date: Sep. 1, 2016

(65) Prior Publication Data
US 2018/0252463 A1    Sep. 6, 2018

(30) Foreign Application Priority Data
Feb. 23, 2015    (DE) .................. 10 2015 203 150

(51) Int. Cl.
*A47B 96/04*    (2006.01)
*F25D 23/02*    (2006.01)
(Continued)

(52) U.S. Cl.
CPC ......... *F25D 23/028* (2013.01); *F25D 29/005* (2013.01); *F25D 2323/024* (2013.01);
(Continued)

(58) Field of Classification Search
CPC .............................. F25D 29/00; F25D 23/028
See application file for complete search history.

(56) References Cited

U.S. PATENT DOCUMENTS

| 4,241,337 A | 12/1980 | Prada |
| 8,342,480 B2* | 1/2013 | Hendrickson ........... F25D 29/00 141/347 |

(Continued)

FOREIGN PATENT DOCUMENTS

| EP | 2792980 A1 | 10/2014 |
| JP | 2004324980 A | 11/2004 |

(Continued)

*Primary Examiner* — Matthew W Ing
(74) *Attorney, Agent, or Firm* — Laurence A. Greenberg; Werner H. Stemer; Ralph E. Locher

(57) ABSTRACT

A domestic refrigeration appliance includes a thermally insulated housing which limits a coolable interior chamber provided for storing food and being accessible through an opening. A frame-shaped end face frames the opening of the housing. A door leaf for opening and closing the opening of the housing is mounted in such a way that it can pivot relative to an axis by using at least one hinge. A cover is provided for covering the hinge. A triggering device is disposed within the cover and is configured to actuate at least one device of the domestic refrigeration appliance depending on an opening angle of the door leaf. A method for operating a domestic refrigeration appliance is also provided.

14 Claims, 5 Drawing Sheets

(51) Int. Cl.
    *F25D 29/00*    (2006.01)
    *H03K 17/97*    (2006.01)
(52) U.S. Cl.
    CPC ...... *F25D 2500/06* (2013.01); *F25D 2700/02* (2013.01); *H03K 17/97* (2013.01)

(56) References Cited

U.S. PATENT DOCUMENTS

| | | | | |
|---|---|---|---|---|
| 8,382,065 B2* | 2/2013 | Hendrickson | ............ | F25D 29/00 141/347 |
| 8,387,948 B2* | 3/2013 | Kuehl | ................. | F16L 37/20 141/347 |
| 8,405,253 B2* | 3/2013 | McCoy | ................. | H01R 13/71 307/116 |
| 8,430,221 B2* | 4/2013 | Kuehl | ................. | F16D 11/10 192/114 R |
| 8,439,178 B2* | 5/2013 | Kuehl | ................. | F16D 1/10 192/30 W |
| 2012/0144847 A1* | 6/2012 | Lee | ................. | F25D 27/005 62/56 |
| 2012/0286638 A1* | 11/2012 | Lee | ................. | F25D 23/02 312/405 |
| 2016/0123055 A1 | 5/2016 | Ueyama | | |

FOREIGN PATENT DOCUMENTS

| | | | |
|---|---|---|---|
| WO | 2014175643 | A1 | 10/2014 |
| WO | 2015004918 | A1 | 1/2015 |

\* cited by examiner

DOMESTIC REFRIGERATION APPLIANCE AND METHOD FOR OPERATING A DOMESTIC REFRIGERATION APPLIANCE

BACKGROUND OF THE INVENTION

Field of the Invention

The invention relates to a domestic refrigeration appliance and a method for operating a domestic refrigeration appliance.

EP 2 792 980 A1 discloses a domestic refrigeration appliance, which has a refrigeration apparatus embodied in particular as a refrigerant circuit and a thermally insulated housing with a coolable interior chamber provided for storing food and cooled by means of the refrigeration apparatus. The domestic refrigeration appliance further comprises a door leaf for opening and closing the coolable interior chamber, said door leaf being mounted pivotably on the housing with hinges. The domestic refrigeration appliance of EP 2 792 980 A1 has a camera apparatus and a recognition unit, which can comprise an optical sensor, a mechanical switch, a magnetic sensor or a camera. The recognition unit is configured to recognize an opening and closing of the door leaf and an opening angle of the door leaf by analyzing signals generated by the sensors and images produced by means of the camera. The domestic refrigeration appliance is designed to switch the camera apparatus to a standby mode as the door leaf opens. In order to create an image of the interior of the coolable interior chamber, as the door leaf closes the camera apparatus is triggered at an opening angle smaller than a predetermined opening angle, by comparing the opening angle of the closing door with the predetermined opening angle.

SUMMARY OF THE INVENTION

It is the object of the present invention to specify an improved domestic refrigeration appliance with a coolable interior chamber and a door leaf provided for opening and closing the coolable interior chamber.

The object of the invention is achieved by a domestic refrigeration appliance, having a thermally insulated housing, which delimits a coolable interior chamber that is provided for storing food and is accessible through an opening and which comprises a frame-like end face which frames the opening of the housing, a refrigeration apparatus provided for cooling the coolable interior chamber, a door leaf for opening and closing the opening of the housing, said door leaf being mounted with at least one hinge in such a manner that it can pivot in relation to an axis, a cover provided for covering the hinge and a trigger apparatus arranged within the cover, which is designed to activate at least one apparatus of the domestic refrigeration appliance as a function of an opening angle of the door leaf.

The inventive domestic refrigeration appliance comprises the thermally insulated housing, which delimits the coolable interior chamber. Said chamber is cooled by means of the refrigeration apparatus. This latter is preferably configured in the manner of a refrigerant circuit known in principle to the person skilled in the art and is preferably embodied in such a manner that it cools the coolable interior chamber at least roughly to a predetermined temperature.

The coolable interior chamber can be closed by means of the door leaf. The door leaf is mounted by means of the at least one hinge in such a manner that it pivots in relation to the axis, which preferably runs vertically. In the opened state the coolable interior chamber is accessible through the opening of the housing.

The housing can have an upper wall facing upward with one face facing away from the coolable interior chamber. The hinge is preferably fastened to this face of the upper wall, for example by means of screws.

The inventive domestic appliance comprises the apparatus, which is activated or can be activated by means of the trigger apparatus as a function of the opening angle of the door leaf. According to a preferred embodiment of the inventive domestic refrigeration appliance said apparatus is a camera, which is designed to be activated by the trigger apparatus to produce an image of the coolable interior chamber. According to this variant of the inventive domestic appliance it therefore comprises at least one camera, the trigger apparatus being designed to activate the at least one camera of the domestic refrigeration appliance as a function of an opening angle of the door leaf so that the at least one camera produces an image of the coolable interior chamber.

The inventive domestic refrigeration appliance can have an interface, by way of which the image or an image data record assigned to the image can be transmitted to a device that can be operated independently of the domestic refrigeration appliance. The device is for example a computer connected to the internet or a mobile terminal, e.g. a smartphone or tablet PC. In particular the domestic refrigeration appliance can transfer the image data record by way of the interface to the device by way of the internet or another communication connection. This allows a person to view an image of the current content of the domestic refrigeration appliance away from the domestic refrigeration appliance, in order to gain information for example about the current stock of food stored in the coolable interior chamber.

The inventive domestic refrigeration appliance further comprises the cover, which is provided to cover the hinge. According to the invention the trigger apparatus is also arranged within the cover. The cover therefore covers not only the hinge but also the trigger apparatus. The cover is preferably made of plastic.

The trigger apparatus of the inventive domestic refrigeration appliance is preferably designed in such a manner that it only activates the at least one apparatus, in particular the at least one camera, as the door leaf pivots from its open position to its closed position, in particular at a predetermined opening angle. If the apparatus is the camera for example and it is fastened in or to the face of the door leaf facing the coolable interior chamber, said opening angle can be set to the recording angle of the camera, in such a manner that the image produced using the camera where possible shows the entire coolable interior chamber. As when the camera is the apparatus, the image of the coolable interior chamber is only produced as the door leaf closes, the image also shows the current stock of food in the coolable interior chamber. According to this variant therefore the trigger apparatus is preferably designed only to activate the at least one camera of the domestic refrigeration appliance at the predetermined opening angle of the door leaf as the door leaf pivots from its open position to its closed position, so that the at least one camera produces an image of the coolable interior chamber when the door leaf is at the predetermined opening angle.

According to a preferred embodiment the trigger apparatus of the inventive domestic refrigeration appliance is arranged next to the hinge within the cover. To this end the cover has in particular a separating wall, which separates the trigger apparatus from the hinge.

The trigger apparatus can for example be a microswitch or comprise a microswitch which is arranged within the cover. However according to one embodiment of the inventive domestic refrigeration appliance the trigger apparatus is configured as a magnetic sensor or features a magnetic sensor which is arranged within the cover and interacts with a magnet for activating the apparatus which is arranged in or on the door leaf. This allows the trigger apparatus to be embodied as contactless, which in turn is beneficial for its durability. The magnet is preferably a permanent magnet.

The magnet or permanent magnet is preferably fastened in the region of the door leaf facing the hinge. If the hinge is fastened to the upper wall of the housing, the magnet is preferably fastened in the upper region of the door leaf, preferably in or to an upper terminating strip of the door leaf.

The magnetic sensor can preferably be arranged, in particular fastened, within the cover in such a manner that it is arranged at a predetermined point in front of the end face of the housing, so that the magnet, in particular the permanent magnet, is in the effective range of the magnetic sensor when the door leaf is at a predetermined opening angle.

The permanent magnet is preferably arranged in or on the door leaf in such a manner that its north pole and south pole are aligned horizontally preferably in the pivot direction of the door leaf, so that when the door leaf pivots over the predetermined opening angle, the magnetic sensor is able to recognize a north pole/south pole switch and a south pole/north pole switch of the permanent magnet, in other words a pole change of the permanent magnet. Thus according to this variant a permanent magnet of defined length is used, its south pole/north pole or north pole/south pole switch being arranged in the horizontal. In order to achieve the greatest possible accuracy, the permanent magnet is only positioned precisely in one direction. Triggering takes place with the aid of the magnetic sensor, which is fixed permanently in the door hinge or its cover. The magnetic sensor can respond relatively precisely to the south pole/north pole or north pole/south pole switch which always runs in the center mirror axis (equator of the permanent magnet). This produces a relatively simple, favorable and also reliable trigger apparatus. This magnet arrangement can also be repeated a number of times along the horizontal, with the result that a winding measurement that is only determined by the size of the permanent magnets is favorably possible.

The magnetic sensor is for example a Hall sensor.

The magnetic sensor is preferably a unipolar magnetic sensor. Such a magnetic sensor is sensitive according to south pole or north pole type, in other words is more sensitive to south pole or north pole detection. In order to recognize the predetermined opening angle with a relatively high level of accuracy as the door leaf closes, the poles of the permanent magnet are preferably aligned in such a manner that the pole to which the unipolar magnetic sensor responds with greater sensitivity faces away from the housing.

Therefore if the south pole of the permanent magnet faces away from the housing, the unipolar magnetic sensor is preferably south pole sensitive.

However if the south pole of the permanent magnet faces the housing, the unipolar magnetic sensor is preferably north pole sensitive.

The magnetic sensor is preferably located in the rotational alignment of the permanent magnet, in other words the magnetic sensor is directly above the permanent magnet at the predetermined opening angle.

A further aspect of the invention relates to a method for operating the inventive domestic refrigeration appliance, having the following method steps:
  pivoting the door leaf and
  analyzing the signals generated by the magnetic sensor as the door leaf pivots, in order to recognize a north pole/south pole switch or a south pole/north pole switch of the permanent magnet as the door leaf pivots over the predetermined opening angle, in order then to trigger the apparatus, preferably only to trigger the apparatus as the door leaf closes.

According to a preferred embodiment of the inventive domestic refrigeration appliance or the inventive method provision is made for an opening of the door leaf to be recognized in particular by analyzing signals generated by a door opening switch of the domestic refrigeration appliance as the door leaf opens. A door opening switch is also used for example to switch on any interior chamber light present to illuminate the coolable interior chamber when the door leaf is open. The signals generated by the magnetic sensor are then analyzed as the door leaf pivots, in order in particular to recognize a north pole/south pole switch or a south pole/north pole switch of the permanent magnet as the door leaf pivots over the predetermined opening angle. The apparatus is only triggered when the opening of the door leaf has been recognized from the analysis of the signals generated by the magnetic sensor and it is recognized that the door leaf pivots over the predetermined opening angle for the second time, as the door leaf pivots over the predetermined opening angle for the first time when it opens and a second time when it then closes.

Provision can also be made for the signals generated by the magnetic sensor to be analyzed as the door leaf pivots to recognize a north pole/south pole switch or a south pole/north pole switch of the permanent magnet as the door leaf pivots over the predetermined opening angle, in order then only to trigger the apparatus as the door leaf closes. In this process the pole change of the magnetic poles of the permanent magnet is recognized as soon as the door leaf pivots over the opening angle. As the pole change is different as the door leaf opens and closes, the magnetic sensor is able only to trigger at the opening angle of the closing door leaf.

The hinge is preferably made of metal. The magnetic sensor is preferably arranged next to the hinge within the cover. This at least reduces the risk of the hinge made of metal having a negative influence on the magnetic sensor. The cover in particular has a separating wall, which separates the magnetic sensor from the hinge.

The cover can preferably comprise a chamber featuring the separating wall, within which the trigger apparatus is arranged. Said chamber means that the trigger apparatus is at least partially protected from the environment.

The trigger apparatus can be fastened directly to the cover for example. According to one variant of the inventive domestic refrigeration apparatus it comprises a support, to which the trigger apparatus is fastened. The support is fastened to the cover. The support is preferably made of plastic.

The support is preferably fastened to the cover in such a manner that it forms a chamber with the separating wall of the cover that may be present, the trigger apparatus being arranged within said chamber. This allows the trigger apparatus to be arranged within the chamber relatively easily.

The support preferably forms a wall segment of the chamber. This wall segment has one face facing the chamber and one face facing away from the chamber. The trigger apparatus is then preferably fastened to the face facing the chamber and the face of the support facing away from the chamber preferably faces the door leaf. Particularly if the trigger apparatus is configured as the magnetic sensor or features the magnetic sensor, the magnetic sensor is fastened to the face of the support facing the chamber within the chamber and as the face of the support facing away from the chamber preferably faces the door leaf, the conditions are created for the magnet to pass reliably into the effective range of the magnetic sensor when the door leaf pivots.

BRIEF DESCRIPTION OF THE SEVERAL VIEWS OF THE DRAWING

An exemplary embodiment of the invention is shown by way of example in the accompanying schematic drawings, in which.

DESCRIPTION OF THE INVENTION

Figure 1:
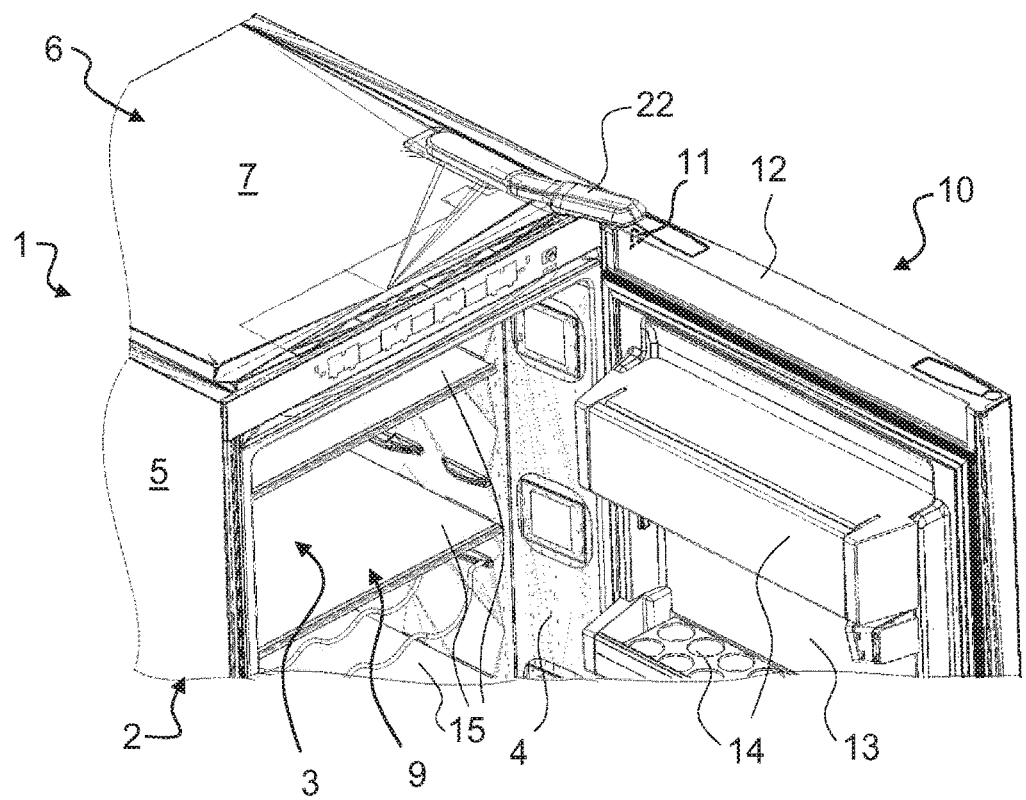
FIG. 1 shows a part of a domestic refrigeration appliance with a housing and with a door leaf fastened pivotably to the housing by means of hinges.
Figure 2:
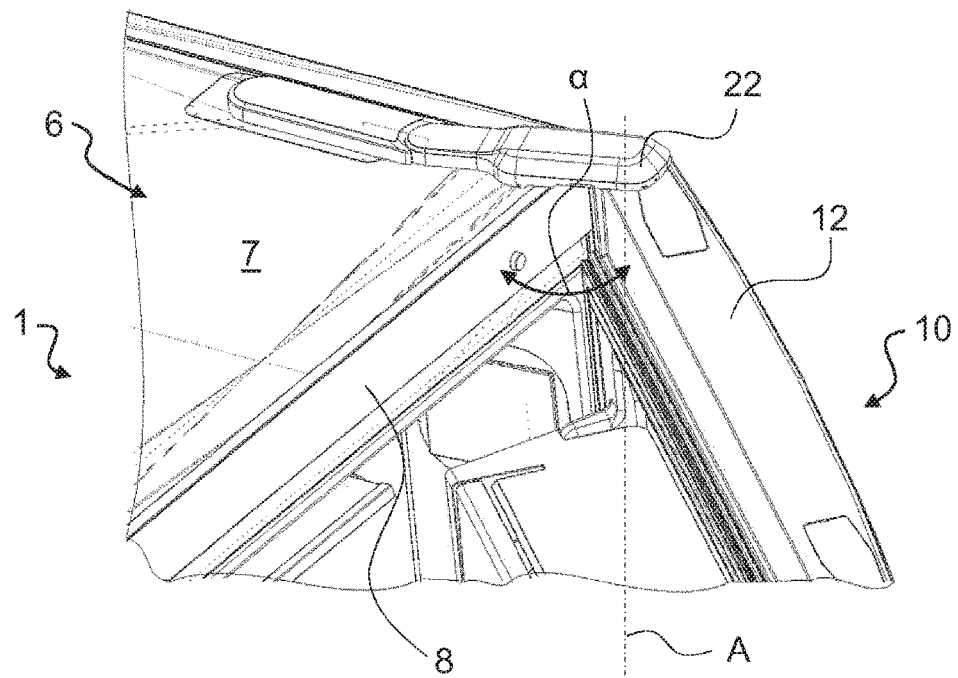
FIG. 2 shows a detail of the domestic refrigeration appliance.

FIG. 1 shows a perspective view of the upper part of a domestic refrigeration appliance 1 and FIG. 2 shows a detail of the domestic refrigeration appliance 1.

The domestic refrigeration appliance comprises a thermally insulated housing 2, which delimits a coolable interior chamber 3. The coolable interior chamber 3 is provided for storing food (not shown in detail).

The housing 2 comprises faces facing the coolable interior 3, which are preferably formed by an inner container 4, and faces facing away from the coolable interior chamber 3. Between these is thermal insulation, preferably a generally known insulating foam. In particular the housing 2 has two side walls 5 and an upper wall 6 with a face 7 facing upward and away from the coolable interior chamber 3. The housing 2 or the coolable interior chamber 3 has a frame-like end face 8, which frames an opening 9 of the housing 2.

The domestic refrigeration appliance 1 comprises a refrigeration apparatus (not shown in detail) known in principle to the person skilled in the art in the form of a refrigerant circuit for cooling the coolable interior chamber 3. The refrigerant circuit comprises for example a compressor, a condenser connected downstream of the compressor, a restrictor apparatus connected downstream of the condenser, embodied in particular as a restrictor tube or capillary tube, and an evaporator, which is arranged between the restrictor apparatus and the compressor.

In the present exemplary embodiment the domestic refrigeration appliance 1 comprises an electronic control apparatus (not shown in detail), which is designed to activate the refrigeration apparatus, in particular the compressor of the refrigerant circuit, in a manner generally known to the person skilled in the art in such a manner that the coolable interior chamber 3 has at least roughly a predetermined or predeterminable target temperature. The electronic control apparatus is preferably designed such that it regulates the temperature of the coolable interior chamber 3. In order to take the actual temperature of the coolable interior chamber 3 if required, the domestic refrigeration appliance 1 can have at least one temperature sensor (not shown in detail) connected to the electronic control apparatus.

The domestic refrigeration appliance 1 can have just one coolable interior chamber 3 or a number of coolable interior chambers, which are preferably arranged one above the other. In the latter instance the domestic refrigeration appliance 1 is then preferably a combined refrigerator/freezer appliance.

The domestic refrigeration appliance 1 has a pivotable door leaf 10 for opening and closing the coolable interior chamber 3 or its opening 9. The door leaf 10 is mounted by means of hinges in such a manner that it pivots in particular in relation to a vertical axis A relative to the housing 2. When the door leaf 10 is open, as shown in FIG. 1, the coolable interior chamber 3 is accessible through its opening 9.

The door leaf 10 comprises in particular inter alia an outer skin facing away from the coolable interior chamber 3, an inner skin 13 facing the coolable interior chamber 3, to which at least one door tray 14 can be fastened, and a terminating strip 12 terminating the door leaf 10 in an upward direction. The at least one door tray 14 is provided for storing food.

Compartment bases 15 provided for storing food can be arranged within the coolable interior chamber 3.

The hinges are fastened to the housing 2 in particular. The door leaf 10 is mounted pivotably in particular by means of an upper hinge 21 and with a lower hinge (not shown in detail).

In the present exemplary embodiment the upper hinge 21 is fastened to the face 7 of the upper wall 6 of the housing 2 facing upward and away from the coolable interior chamber 3.

The upper hinge 21 is covered by means of a cover 22. This is preferably made of plastic and as a single piece.

The domestic refrigeration appliance 1 also comprises a trigger apparatus preferably embodied as a magnetic sensor 23, which is fastened on a support 24 in the present exemplary embodiment. The support 24 is fastened in turn to the cover 22 and is covered by this. It is however also possible for the trigger apparatus or magnetic sensor 23 to be fastened directly in the cover 22 and to be covered by this. The support 24 is preferably made of plastic.

Figure 3:
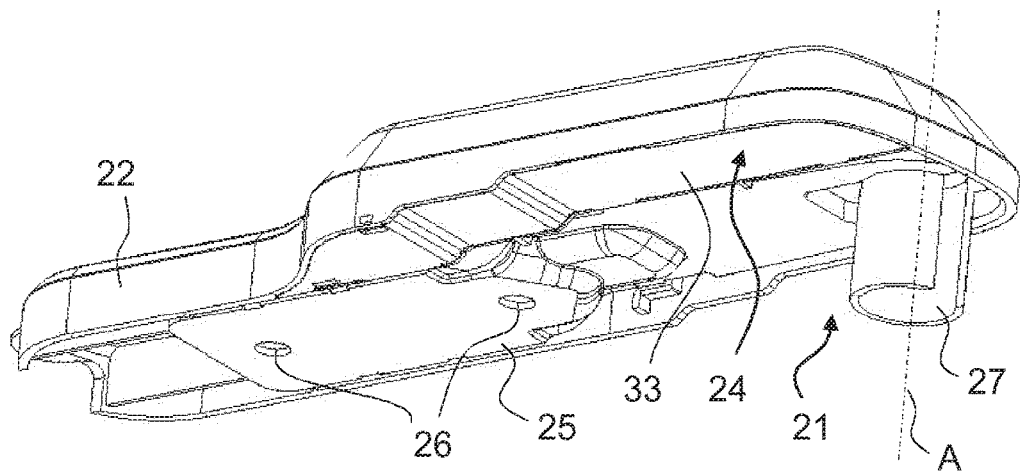
FIG. 3 shows one of the hinges including a cover for the hinge and a support for a magnetic sensor fastened within the cover.

FIG. 3 shows a perspective view from above of the upper hinge 21 including the cover 22 and the support 24 for the magnetic sensor 23 from below.

Figure 4:
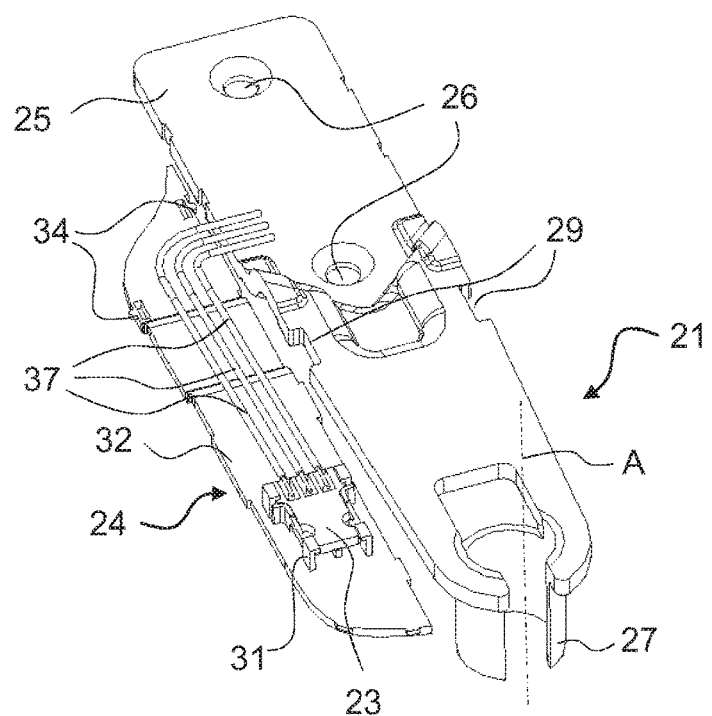
FIG. 4 shows the hinge and the support with the magnetic sensor.
Figure 5:
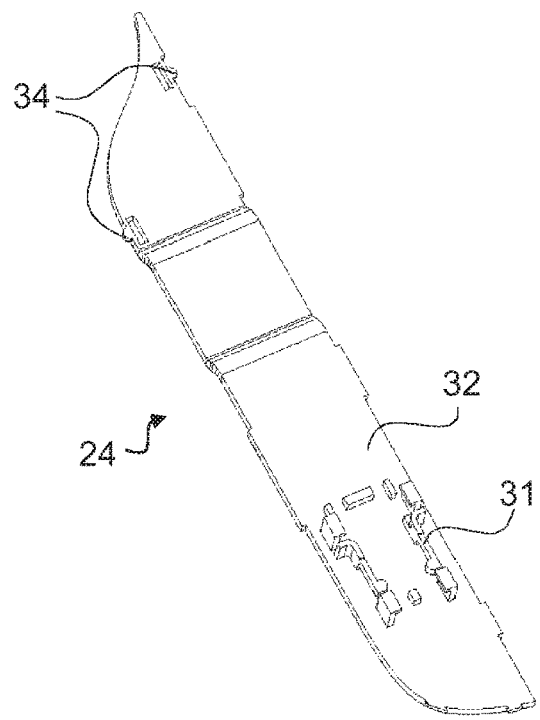
FIG. 5 shows the support without the magnetic sensor.

FIG. 4 shows a perspective view of the upper hinge 21 and the support 24 with magnetic sensor 23 fastened thereto but with the cover 22 removed and FIG. 5 only shows the support 24 without the magnetic sensor 23.

Figure 7:
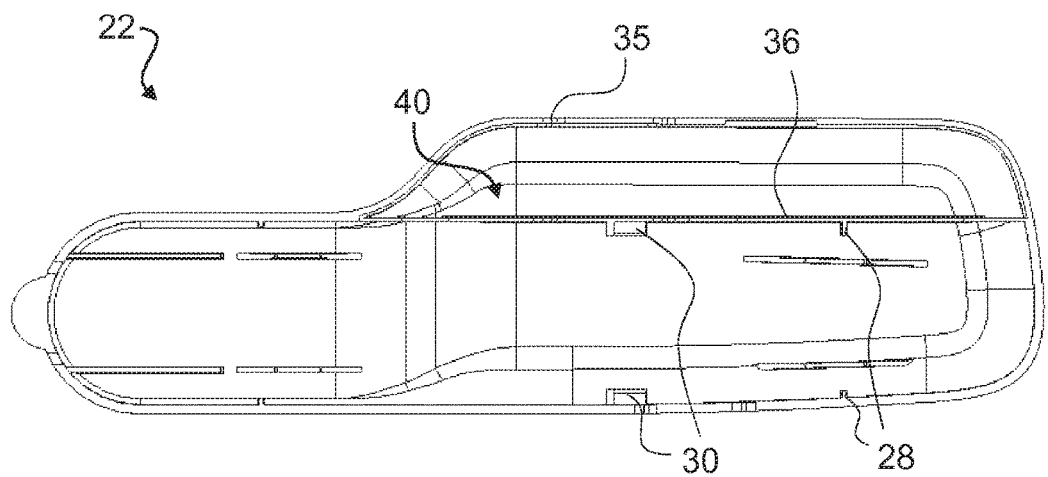
FIGS. 6 and 7 show different views of the cover.
Figure 6:
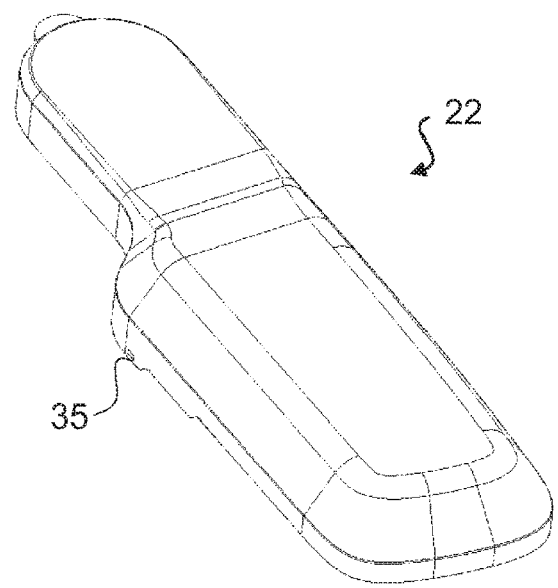

FIG. 6 shows a perspective view of the cover 22 from above and FIG. 7 shows the cover 22 from below.

Figure 8:
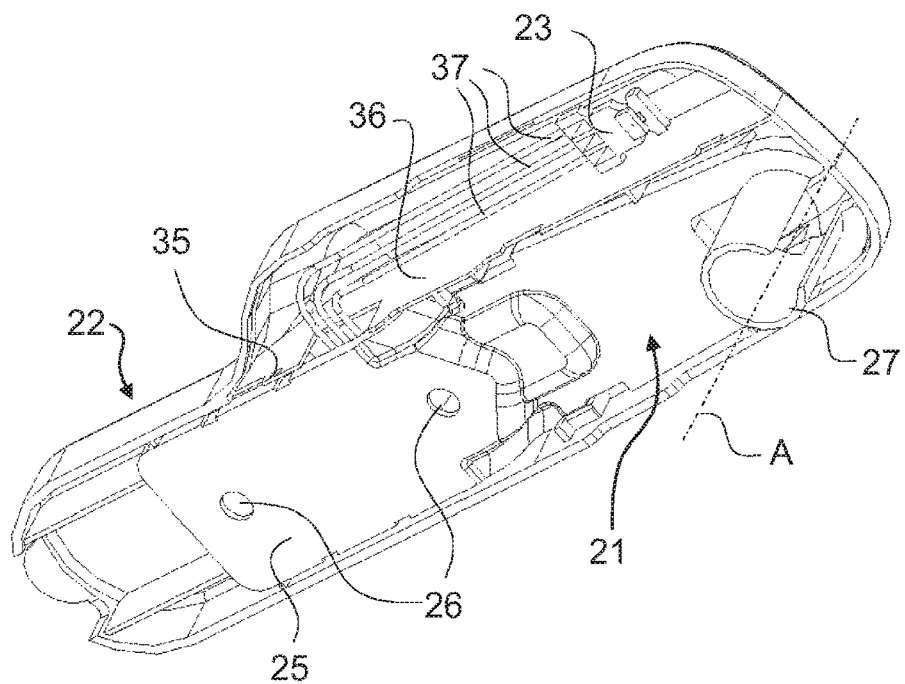
FIG. 8 shows the hinge, the magnetic sensor and the cover.

FIG. 8 shows a perspective view of the upper hinge 21, the magnetic sensor 23 and the cover 22 from below but without the support 24.

The upper hinge 21 is made of metal for example and in the present exemplary embodiment comprises a fastening apparatus 25, by means of which the upper hinge 21 is fastened to the housing 2. The fastening apparatus 25 of the upper hinge 21 is preferably embodied in the manner of a plate and comprises at least one opening or hole 26, preferably a number of openings or holes 26, by means of which the upper hinge 21 is screwed to the upper wall 6 of the housing 2.

In the present exemplary embodiment the upper hinge 21 comprises a bearing apparatus 27, which is preferably embodied as a cylindrical bush. The bearing apparatus 27 or bush is provided to support the door leaf 10 pivotably. To this end the door leaf 10 comprises a counter bearing apparatus (not shown in detail) which corresponds to the bearing apparatus 27 and in the present exemplary embodiment is configured as an opening in the door leaf 10 corresponding to the bush. The door leaf 10 is suspended in the bush by means of this opening. The upper hinge 21 in particular forms a bearing angle.

The upper hinge 21 is preferably embodied in such a manner that the bearing apparatus 27 or bush projects beyond the opening 9 of the housing 2 or beyond the end face 8 of the housing 2, so that the axis A runs in front of the housing 2 or its end face 8.

In the present exemplary embodiment the cover 22 is fastened to the upper hinge 21, in particular to its fastening apparatus 25, preferably being latched thereto. To this end in the present exemplary embodiment the cover 22 comprises latching hooks 28, by means of which the cover 22 is latched to the upper hinge 21, in particular to its fastening apparatus 25.

In the present exemplary embodiment the fastening apparatus 25 of the upper hinge 21 has two recesses 29, which interact with corresponding webs 30 on the cover 21, so that the cover 30 can be positioned and fixed as precisely as possible relative to the upper hinge 21.

In the present exemplary embodiment the magnetic sensor 23 is fastened to the support 24, preferably being latched thereto. The support 24 in particular comprises a fastening apparatus 31, by means of which the magnetic sensor 23 is fastened to the support 24. The fastening apparatus 31 of the support 24 for example comprises a number of latching hooks for latching the magnetic sensor 23 to the support 24.

The support 24 has one face 32 facing away from the upper wall 6 of the housing 2 and one face 33 facing the upper wall 6 of the housing 2. In the present exemplary embodiment provision is made for the magnetic sensor 23 to be fastened to the support 24 on the face 32 of the support 24 facing away from the upper wall 6 of the housing 2.

The support 24 is fastened to the cover 22, preferably being latched thereto. To this end the support 24 comprises latching hooks 34, which latch to corresponding openings 35 in the cover 22.

In the present exemplary embodiment the magnetic sensor 23 is arranged next to the hinge 21 and the cover 22 comprises a separating wall 36. In the present exemplary embodiment therefore the separating wall 36, the support 24 and the cover 22 substantially form a closed chamber 40, within which the magnetic sensor 23 is arranged.

Electric lines 37 in particular are provided for supplying the magnetic sensor 23 with electrical energy and for transmitting signals generated by means of the magnetic sensor 23.

The magnetic sensor 23 is arranged in such a manner that it projects beyond the opening 9 of the housing 2 or beyond the end face 8 of the housing 2 at a predetermined point, so that the effective range of the magnetic sensor 23 runs in front of the housing 2 or its end face 8.

Provision is made in particular for the magnetic sensor 23 to be able to interact with a magnet, in particular a permanent magnet 11, fastened in or to the door leaf 10, as soon as the permanent magnet 11 is present in the effective range of the magnetic sensor 23.

In the present exemplary embodiment provision is made for the permanent magnet 11 to be fastened in or to the door leaf 10 in its upper region, preferably in or to the upper terminating strip 12, in such a manner that when the door leaf 10 pivots, the permanent magnet 11 moves into the effective range of the magnetic sensor 23 at a predetermined opening angle α. The opening angle α is preferably around 50°. This state of the door leaf 10 is shown in FIG. 2.

In the present exemplary embodiment provision is made for the magnetic sensor 23 only to "trigger", in other words to generate a signal, in particular an electrical signal, at the opening angle α, as the door leaf 10 pivots from its open position to its closed position, thereby passing through the opening angle α. However the magnetic sensor 23 should not "trigger" as the door leaf 10 opens.

In order to achieve this, provision can be made for the permanent magnet 11 to be aligned in such a manner that when the door leaf 10 pivots, the magnetic sensor 23 recognizes a pole change of the magnetic poles of the permanent magnet 11, as soon as the door leaf 10 pivots over the opening angle α. As the pole change is different as the door leaf 10 opens and closes, the magnetic sensor 23 is able only to trigger at the opening angle α of the closing door leaf 10.

Figure 9:
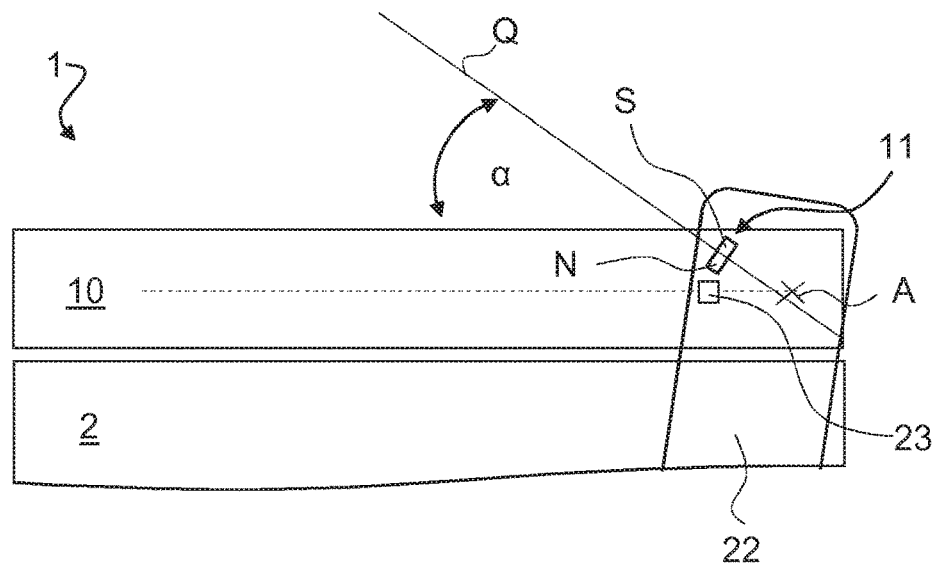
FIG. 9 shows a top view of the domestic refrigeration appliance.

FIG. 9 shows a top view of the domestic refrigeration appliance 1 with the door leaf 10 closed.

The permanent magnet 11 has a north pole N and a south pole S. The permanent magnet 11 is preferably arranged in or on the door leaf 10 in such a manner that its north pole N and south pole S are aligned horizontally, preferably in the pivot direction, so that when the door leaf 10 pivots over the predetermined opening angle α, the magnetic sensor 23 is able to recognize a north pole/south pole switch and a south pole/north pole switch of the permanent magnet 10, in other words the pole change of the permanent magnet 11. The recognized switch between the North Pole N and the south pole S or vice versa makes it easier to recognize when the door leaf 10 is at the predetermined opening angle α. In particular the permanent magnet 11 is fastened in or to the door leaf 10 and the magnetic sensor 23 in the cover 22 in such a manner that at the predetermined opening angle α the magnetic sensor 23 is located above the equator Q of the permanent magnet 11 or its extension.

In the present exemplary embodiment the permanent magnet 11 is arranged in the door leaf 10 in such a manner that its north pole faces the housing 2 and its south pole faces away from the housing. The magnetic sensor 23, which is configured for example as a Hall sensor, is preferably a unipolar magnetic sensor, which is south pole sensitive in the present exemplary embodiment. This alignment of the permanent magnet 11 and the selection of the magnetic sensor 23 mean that when the door leaf 11 closes, the north pole N of the permanent magnet 11 passes into the effective range of the magnetic sensor 23 first and then the south pole S. Because the magnetic sensor 23 is south pole sensitive, the north pole/south pole switch can be recognized reliably and with a relatively high level of accuracy, allowing the predetermined opening angle α to be recognized.

Figure 10:
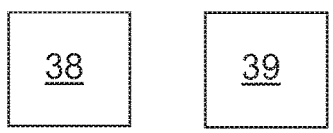
FIG. 10 shows a camera and an interface of the domestic refrigeration appliance.

The magnetic sensor 23 is provided to activate at least one apparatus of the domestic refrigeration appliance 1 when the closing door leaf 10 passes through the opening angle α. In the present exemplary embodiment this apparatus is configured as a camera 38 as shown in FIG. 10.

Thus in the present exemplary embodiment the magnetic sensor 23 triggers at least one camera 38 of the domestic refrigeration appliance 1, as soon as the closing door leaf 10 passes through the opening angle α.

The magnetic sensor 23 is preferably located in the rotational alignment of the permanent magnet 11, in other words the magnetic sensor 23 is directly above the permanent magnet 11 at the predetermined opening angle α.

In order to recognize that the door leaf 10 is currently pivoting from its open position to its closed position, in the present exemplary embodiment the domestic refrigeration appliance 1 is designed to recognize an opening of the door leaf 10 by analyzing signals generated by a door opening switch of the domestic refrigeration appliance 10 as the door leaf 10 opens. The door opening switch is not shown specifically. It is however known in principle to the person skilled in the art and is normally used to switch on an interior chamber light (also not shown) to illuminate the coolable interior chamber when the door leaf 10 is open.

The signals generated by the magnetic sensor 23 are then analyzed using the electronic control apparatus as the door leaf 10 pivots to recognize a north pole/south pole switch or a south pole/north pole switch of the permanent magnet 11 as the door leaf 10 pivots over the predetermined opening angle α. The apparatus or camera 38 is only triggered when the opening of the door leaf 10 has been recognized from the analysis of the signals generated by the magnetic sensor 23 and it is recognized that the door leaf pivots over the predetermined opening angle α for the second time, as the door leaf pivots over the predetermined opening angle α for the first time when it opens and a second time when it then closes.

The at least one camera 38 is provided to produce an image of the interior of the coolable interior chamber 3 or an image data record assigned to said image. The camera 38 is fastened in or to the door leaf 10 for example or in or to the inner container 4.

The inventive domestic refrigeration appliance 1 can also have an interface 39, by way of which the image data record can be transmitted to a further device, e.g. a mobile terminal or a device connected to the internet.

LIST OF REFERENCE CHARACTERS

1 Domestic refrigeration appliance
2 Housing
3 Coolable interior chamber
4 Inner container
5 Side walls
6 Upper wall
7 Face
8 End face
9 Opening
10 Door leaf
11 Permanent magnet
12 Upper terminating strip
13 Inner skin
14 Door tray
15 Compartment bases
21 Hinge
22 Cover
23 Magnetic sensor
24 Support
25 Fastening apparatus
26 Holes
27 Bearing apparatus
28 Latching hooks
29 Recesses
30 Webs
31 Fastening apparatus
32, 33 Face
34 Latching hooks
35 Openings
36 Separating wall
37 Electric lines
38 Camera
39 Interface
40 Chamber
A Axis
N North pole
Q Equator
S South pole
α Opening angle

The invention claimed is:

1. A domestic refrigeration appliance, comprising:
a thermally insulated housing delimiting a coolable interior chamber for storing food, said housing having an opening for accessing said coolable interior chamber;
a frame-shaped end face framing said opening of said housing;
a door leaf for opening and closing said opening of said housing;
a magnet or a permanent magnet being disposed in or on said door leaf and having a north pole and a south pole aligned horizontally in a pivot direction of said door leaf;
at least one hinge mounting said door leaf and permitting said door leaf to pivot relative to an axis;
a cover for covering said at least one hinge;
at least one appliance apparatus; and
a trigger apparatus disposed within said cover and configured to activate said at least one appliance apparatus as a function of an opening angle of said door leaf, said trigger apparatus being or including a magnetic sensor disposed within said cover and interacting with said magnet or permanent magnet for activating said at least one appliance apparatus, said magnetic sensor being disposed within said cover at a predetermined point in front of said frame-shaped end face for locating said magnet in an effective range of said magnetic sensor when said door leaf is at a predetermined opening angle, and said magnetic sensor recognizing a north pole/south pole switch or a south pole/north pole switch of said magnet or said permanent magnet when said door leaf pivots over said predetermined opening angle.

2. The domestic refrigeration appliance according to claim 1, wherein said at least one appliance apparatus is a camera configured to be activated by said trigger apparatus to produce an image of said coolable interior chamber.

3. The domestic refrigeration appliance according to claim 1, wherein said housing includes an upper wall having one face facing upward and away from said coolable interior chamber, said hinge being fastened to said one face.

4. The domestic refrigeration appliance according to claim 1, wherein said trigger apparatus is disposed next to said hinge within said cover.

5. The domestic refrigeration appliance according to claim 4, wherein said cover has a separating wall separating said trigger apparatus from said hinge.

6. The domestic refrigeration appliance according to claim 5, wherein said cover includes a chamber having said separating wall, said trigger apparatus being disposed in said chamber.

7. The domestic refrigeration appliance according to claim 1, which further comprises a support fastened to said cover, said trigger apparatus being fastened to said support.

8. The domestic refrigeration appliance according to claim 1, wherein said trigger apparatus is configured to only activate said at least one appliance apparatus as said door leaf pivots from an open position to a closed position at a predetermined opening angle.

9. The domestic refrigeration appliance according to claim 1, which further comprises:
   a door opening switch generating signals as said door leaf opens, said signals to be analyzed for recognizing an opening of said door leaf;
   said magnetic sensor generating signals to be analyzed as said door leaf pivots for recognizing a north pole/south pole switch or a south pole/north pole switch of said permanent magnet as said door leaf pivots over said predetermined opening angle; and
   said magnetic sensor only triggering said at least one appliance apparatus when said opening of said door leaf has been recognized from said analysis of said signals generated by said magnetic sensor and has recognized that said door leaf has pivoted over said predetermined opening angle for a second time.

10. A domestic refrigeration appliance, comprising:
    a thermally insulated housing delimiting a coolable interior chamber for storing food, said housing having an opening for accessing said coolable interior chamber;
    a frame-shaped end face framing said opening of said housing;
    a door leaf for opening and closing said opening of said housing;
    at least one hinge mounting said door leaf and permitting said door leaf to pivot relative to an axis;
    a cover for covering said at least one hinge;
    at least one appliance apparatus;
    a trigger apparatus disposed within said cover and configured to activate said at least one appliance apparatus as a function of an opening angle of said door leaf; and
    a support fastened to said cover, said trigger apparatus being fastened to said support, said support fastened to said cover forming a chamber along with said separating wall, and said trigger apparatus being disposed in said chamber.

11. The domestic refrigeration appliance according to claim 10, wherein said support forms a wall segment of said chamber, said wall segment has one face facing said chamber and another face facing away from said chamber, said trigger apparatus being fastened to said one face facing said chamber and said other face facing away from said chamber faces said door leaf.

12. A method for operating a domestic refrigeration appliance, the method comprising the following steps:
    using a thermally insulated housing to delimit a coolable interior chamber for storing food, the housing having an opening for accessing the coolable interior chamber;
    using a frame-shaped end face for framing the opening of the housing;
    using a door leaf for opening and closing the opening of the housing;
    using at least one hinge to mount the door leaf and permit the door leaf to pivot relative to an axis;
    using a cover for covering the at least one hinge;
    providing at least one appliance apparatus in or on the door leaf;
    providing a magnet or a permanent magnet being disposed in or on the door leaf and having a north pole and a south pole aligned horizontally in a pivot direction of said door leaf;
    using a trigger apparatus being or including a magnetic sensor disposed within the cover and interacting with the magnet or permanent magnet to activate the at least one appliance apparatus as a function of an opening angle of the door leaf, the magnetic sensor being disposed within the cover at a predetermined point in front of the frame-shaped end face for locating the magnet in an effective range of the magnetic sensor when the door leaf is at a predetermined opening angle;
    pivoting the door leaf; and
    analyzing signals generated by the magnetic sensor as the door leaf pivots to recognize a north pole/south pole switch or a south pole/north pole switch of the permanent magnet as the door leaf pivots over the predetermined opening angle to then trigger the appliance apparatus.

13. The method according to claim 12, which further comprises:
    recognizing an opening of the door leaf by analyzing signals generated by a door opening switch of the domestic refrigeration appliance as the door leaf opens;
    analyzing the signals generated by the magnetic sensor as the door leaf pivots, in order to recognize the north pole/south pole switch or the south pole/north pole switch of the permanent magnet as the door leaf pivots over the predetermined opening angle; and
    only triggering the appliance apparatus when the opening of the door leaf has been recognized from the analysis of the signals generated by the magnetic sensor and it is recognized that the door leaf pivots over the predetermined opening angle for a second time.

14. The method according to claim 12, which further comprises analyzing the signals generated by the magnetic sensor as the door leaf pivots to recognize the north pole/south pole switch or the south pole/north pole switch of the permanent magnet as the door leaf pivots over the predetermined opening angle to only then trigger the apparatus as the door leaf closes.

* * * * *